United States Patent
Chan et al.

(10) Patent No.: US 7,636,653 B1
(45) Date of Patent: Dec. 22, 2009

(54) POINT-TO-POINT ETHERNET HARDWARE CO-SIMULATION INTERFACE

(75) Inventors: Chi Bun Chan, Longmont, CO (US); Jonathan B. Ballagh, Boulder, CO (US); Nabeel Shirazi, San Jose, CA (US); Roger B. Milne, Boulder, CO (US)

(73) Assignee: XILINX, Inc., San Jose, CA (US)

( * ) Notice: Subject to any disclaimer, the term of this patent is extended or adjusted under 35 U.S.C. 154(b) by 698 days.

(21) Appl. No.: 11/343,367

(22) Filed: Jan. 31, 2006

(51) Int. Cl.
G06F 9/455 (2006.01)
G06F 17/50 (2006.01)
(52) U.S. Cl. .............................. 703/14; 703/22; 703/27
(58) Field of Classification Search ................. 703/14, 703/22, 27; 716/17
See application file for complete search history.

(56) References Cited

U.S. PATENT DOCUMENTS

| | | | |
|---|---|---|---|
| 7,246,055 B1* | 7/2007 | Singh | 703/20 |
| 2003/0110464 A1* | 6/2003 | Davidson et al. | 716/17 |
| 2003/0195989 A1* | 10/2003 | Greenblat | 709/251 |
| 2004/0240446 A1* | 12/2004 | Compton | 370/389 |
| 2005/0108379 A1* | 5/2005 | Gray et al. | 709/223 |
| 2006/0206300 A1* | 9/2006 | Garg et al. | 703/27 |

OTHER PUBLICATIONS

U.S. Appl. No. 11/314,486, filed Dec. 21, 2005, Ballagh et al.
Cace Technologies, "WinPcap: The Windows Packet Capture Library", 1 page, available at http://www.winpcap.org/; Jan. 2006.
Xilinx, Inc., Virtex-4 Embedded Tri-Mode Ethernet MAC User Guide, Sep. 7, 2005, pp. 1-160, UG074, (v1.3), available from Xilinx, Inc., 2100 Logic Drive, San Jose, CA 95124.
Xilinx, Inc., "Tri-Mode Ethernet MAC v2.2", DS297, Jan. 18, 2006, Product Specification, pp. 1-20, available from Xilinx, Inc., 2100 Logic Drive, San Jose, CA 95124.
Ethertype, p. 1-42, available at http://standards.ieee.org/regauth/ethertype/eth.txt, Jan. 2006.

* cited by examiner

*Primary Examiner*—Thai Phan
(74) *Attorney, Agent, or Firm*—Kevin T. Cuenot

(57) ABSTRACT

An Ethernet co-simulation interface for use with a software-based simulation tool and a design under test disposed on a programmable device can include a host interface and a network processor. The host interface can execute on a host computing system and facilitate data transfer between the software-based simulation tool and a communication link to the design under test. The network processor can be implemented within the programmable device and facilitate data transfer between the communication link and the design under test. The host interface and the network processor can exchange simulation data formatted as raw Ethernet frames over a point-to-point Ethernet connection.

20 Claims, 4 Drawing Sheets

| | | Ethernet Header | | | Ethernet Payload | | |
|---|---|---|---|---|---|---|---|
| Preamble | Start Frame Delimiter | Destination MAC Address | Source MAC Address | EtherType | Ethernet Header Padding | Metadata Co-simulation Data | FCS |
| 7 Bytes | 1 Byte | 6 Bytes | 6 Bytes | 2 Bytes | 2 Bytes | 4n Bytes | 4 Bytes |

POINT-TO-POINT ETHERNET HARDWARE CO-SIMULATION INTERFACE

BACKGROUND

1. Field of the Invention

The present invention relates to the field of electronic system design and, more particularly, to a hardware co-simulation interface for use with programmable logic devices and software-based simulation tools.

2. Description of the Related Art

Electronic circuit designs can be constructed, simulated, debugged, and translated into electronic hardware using a High Level Modeling System (HLMS). Typically, an HLMS is implemented as a software-based design tool which provides blocks that can be combined to build an electronic circuit. A block refers to a high level software construct that represents a particular circuit function, such as multiplexing, addition, multiplication, or the like. Blocks may have ports that can produce and consume signals, and may be arranged within the HLMS to form a circuit and/or system. Communication among the blocks can be represented by wires, or signals, that graphically link the blocks. The design may be simulated within the HLMS once it is constructed. Some HLMS tools can generate a hardware implementation from the block representation of the circuit design. For example, an HLMS can generate the bitstream necessary to program a field programmable gate array (FPGA) or can generate the hardware description language (HDL) files necessary to specify the hardware design.

One example of an HLMS is System Generator for DSP™, available from Xilinx, Inc. of San Jose, Calif. System Generator for DSP™ is a system level modeling tool that facilitates FPGA hardware design. System Generator for DSP™ provides a wide range of blocks that can be automatically compiled into a design suitable for an FPGA. Among these blocks are high level abstractions that implement complex functions, including digital signal processing as well as communication and control logic. In addition, access to underlying FPGA resources can be provided through low level block abstractions that facilitate the construction of highly efficient FPGA designs.

An electronic design typically is simulated in an HLMS using program logic that models block behavior. It also is possible to incorporate circuit designs, which already have been implemented in hardware, into HLMS simulations. To do so, the computer system hosting the HLMS preferably is connected to the device under test (DUT) via a high bandwidth communication channel, although a low bandwidth communication channel may be used in cases where co-simulation runtime is not of the essence. The DUT typically is a design implemented within a programmable logic device (PLD) such as an FPGA. The PLD is installed on a hardware platform which is coupled to the host computer system via a communication link. The process of running a simulation involving a hardware platform and a software platform working cooperatively with one another is referred to as hardware co-simulation, or simply co-simulation, as used herein.

There are several different types of interfaces available for use with co-simulation environments. For example, co-simulation interfaces can be implemented using the Joint Test Action Group (JTAG) or IEEE Standard 1149.1 communication protocol or as Peripheral Component Interconnect (PCI) connections. In addition to JTAG and PCI interfaces, it is also possible to perform co-simulation using an IP/Ethernet-based interface. Typically, an IP/Ethernet-based interface utilizes a multilayer network protocol stack. As such, an IP/Ethernet-based interface can provide the flexibility, interoperability, and extensibility commonly expected from the IP/Ethernet-based networks in existence today.

While an IP/Ethernet-based interface does provide significant flexibility, a fully capable IP/Ethernet interface carries a large amount of overhead. A fully capable IP/Ethernet co-simulation interface, for example, typically has the ability to handle networking complexities such as address resolution, switching and routing, system configuration, collisions, and congestion. A fully enabled IP/Ethernet-based interface also requires the use of a protocol stack on the host as well as on the PLD with which the host communicates.

When an IP/Ethernet connection is used for co-simulation, functions such as address resolution, translation and routing, system configuration, collisions, and congestion can degrade the speed of co-simulation. Additionally, implementing a protocol stack on a PLD, such as an FPGA, can be costly in terms of the hardware resources that are required. For example, a network protocol stack implementation on an FPGA usually requires the use of a soft or embedded processor in the fabric of the device. Another challenge of a fully capable IP/Ethernet co-simulation implementation on a PLD is that it is difficult to maintain the speed of "in-fabric" packet processing at the same level as the speed of the IP/Ethernet connection itself.

It would be beneficial to implement a co-simulation interface which overcomes the deficiencies described above.

SUMMARY OF THE INVENTION

The present invention provides a software and hardware architecture for a hardware co-simulation interface and method of using the same. The embodiments disclosed herein facilitate communication between a host computing system and a device under test (DUT) that is implemented on a programmable logic device (PLD). One embodiment of the present invention can include an Ethernet co-simulation interface for use with a software-based simulation tool and a DUT disposed on a PLD. The co-simulation interface can include a host interface executing on a host computing system. The host interface facilitates data transfer between the software-based simulation tool and a communication link to the DUT. The co-simulation interface also can include a network processor implemented within the PLD. The network processor facilitates data transfer between the communication link and the DUT. The host interface and the network processor further can exchange simulation data formatted as Ethernet frames over a point-to-point Ethernet connection.

In one embodiment, the host interface can include a co-simulation engine that translates commands from a non-platform specific format compatible with the host computing system into a platform specific format that conforms to the PLD. The host interface also can include a hardware interface and an Ethernet packet processing layer. The hardware interface can communicatively link the host computing system with the point-to-point Ethernet connection and the Ethernet packet processing layer can capture packets received over the point-to-point Ethernet connection and format packets for transmission over the point-to-point Ethernet connection.

The network processor, residing within the PLD, can include an Ethernet media access control that routes co-simulation data between the point-to-point Ethernet connection and an ingress buffer and an egress buffer of the network processor. In another embodiment, the network processor also can include a command processor configured to route co-simulation data between the network processor and an interface to the DUT. The command processor can be included within the network processor or may be a separate component entirely.

A network processor controller can be included that can extract co-simulation commands and co-simulation data from raw Ethernet frames stored within the ingress buffer and provide the co-simulation commands and co-simulation data to the command processor. The network processor controller further can format co-simulation data from the command processor as outgoing, raw Ethernet frames and provide the outgoing, raw Ethernet frames to the egress buffer. In addition, the network processor can be implemented such that it does not include processor logic or program code for executing a network protocol stack. The network processor further can be reconfigured at co-simulation runtime.

Another embodiment of the present invention can include a method of routing co-simulation data between a software-based simulation tool executing on a host computing system and a design under test implemented on a PLD. The method can include, within the host computing system, translating a co-simulation command between a non-platform specific format that conforms to the host computing system and a platform specific format that conforms to the DUT. Also within the host computing system, the method can include encapsulating the co-simulation command that conforms with the platform specific format as one or more raw Ethernet frames for transmission over a point-to-point Ethernet connection to the PLD. The method further can include, within the PLD, buffering the raw Ethernet frame from the host computing system in an ingress buffer and extracting the co-simulation command from the raw Ethernet frame. The co-simulation command can be provided to the DUT for execution.

Within the PLD, received raw Ethernet frames can be qualified as being ready to use for hardware co-simulation according to a comparison with a predefined packet structure stored within the ingress buffer. Co-simulation data can be received from the DUT and placed in an egress buffer within the PLD, whereby an Ethernet header is inserted into the co-simulation data to format the co-simulation data as at least one raw Ethernet frame.

The PLD can be configured to process raw Ethernet frames without a processor for executing a network protocol stack. The method further can include, within the host computing system, updating a bitstream used to configure at least a portion of the PLD at co-simulation runtime. Responsive to a bitstream specifying Ethernet configuration information, at least a portion of the PLD can be configured at co-simulation runtime.

Another embodiment of the present invention can include a machine readable storage, having stored thereon, a computer program having a plurality of code sections executable by a machine for causing the machine to perform the various steps disclosed herein.

BRIEF DESCRIPTION OF THE DRAWINGS

There are shown in the drawings, embodiments which are presently preferred, it being understood; however, that the invention is not limited to the precise arrangements and instrumentalities shown.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The present invention provides a solution for a hardware co-simulation interface. In accordance with the embodiments disclosed herein, a hardware co-simulation interface is disclosed that is suitable for exchanging "raw" Ethernet frames over a point-to-point Ethernet communication link. The hardware co-simulation interface can be implemented partially within a host computing system and partially within a programmable logic device (PLD). The embodiments disclosed herein provide an efficient hardware co-simulation interface that requires less networking functionality and supporting components than other fully-enabled Ethernet-based interfaces.

Figure 1:
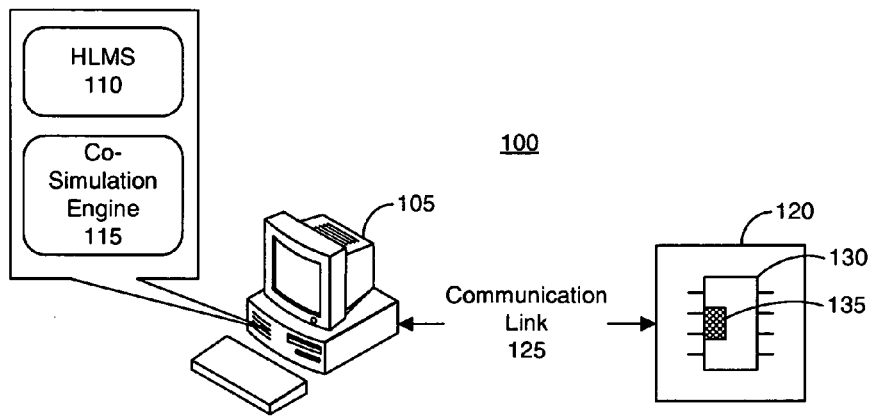
FIG. 1 is a schematic diagram illustrating a system for performing hardware co-simulation in accordance with one embodiment of the present invention.

FIG. 1 is a schematic diagram illustrating a system 100 for performing hardware co-simulation in accordance with one embodiment of the present invention. As shown, system 100 can include a host computer system 105 which can execute a high level modeling system (HLMS) 110 and a co-simulation engine 115. The host computer system 105 is communicatively linked with a hardware platform 120 via a communication link 125. The hardware platform 120 includes a PLD 130, such as a field programmable gate array (FPGA), which further includes a network processor 135 disposed therein. As noted, co-simulation, or hardware co-simulation, refers to the situation in which a hardware design, in this case implemented in PLD 130, is incorporated within a design and/or simulation environment such as HLMS 110. This allows an actual hardware design implementation to be tested in conjunction with various software-based models of physical systems and/or components.

Communications between the host computer system 105 and the hardware platform 120 can be formatted and conducted according to a specified communication protocol. In one embodiment of the present invention, communications can be formatted and conducted using a point-to-point Ethernet communication link as specified in IEEE standard 802.3. As used herein, the phrase "point-to-point Ethernet connection" refers to a connection where the host processing system and the PLD are not located across a network, but rather have a direct linkage between one another.

In one embodiment, a point-to-point Ethernet connection can refer to a connection that is established using the raw Layer-2, i.e. the data link layer, of the Ethernet protocol within a same broadcast domain. One example of such a connection is an Ethernet local area network constructed using a direct linkage or a Layer-2 Ethernet switch. Within such a configuration, data can be addressed directly with unique Ethernet media access control (MAC) addresses without any higher layer of network protocol encapsulation, address translation, and/or routing. Still, it should be appreciated that the present invention can be used with any of a variety of different communication system configurations and/or protocols depending upon the particular application to which the inventive arrangements are to be applied.

The HLMS 110 typically includes a hardware co-simulation block (not shown), which is a software proxy for the PLD 130. The hardware co-simulation block can function much the same way as other software blocks of the HLMS 110 in that signals from other blocks (i.e. software-based models of physical components and/or systems) within the HLMS 110 can be consumed by the hardware co-simulation block and signals generated by hardware co-simulation block can be provided to, and interpreted by, other blocks within the HLMS 110.

The hardware co-simulation block communicates with a co-simulation engine 115 that typically is distinct from the HLMS 110, but can execute within the host computer system 105. In general, the hardware co-simulation block provides generic function calls to the co-simulation engine 115. These generic function calls can include, but are not limited to, opening and closing the hardware platform 120, managing data I/O with the hardware platform 120, and controlling clock sources for the PLD 130. The co-simulation engine 115 translates the generic function calls from the hardware co-simulation block into instructions specific to the hardware platform 120, and thus, the PLD 130. The instructions are sent from the co-simulation engine 115 to the hardware platform 120 via communication link 125.

The network processor 135 disposed within the PLD 130 can perform tasks including, but not limited to, packet filtering, header removal, header injection, clock domain crossing, data marshalling, as well as data-width conversion. It should be appreciated that the particular network-related tasks to be performed by the network processor 135 can vary depending upon the application and/or the communication protocol used. Accordingly, the list of networking operations disclosed herein is not intended to be a limitation of the present invention, but rather serve as examples of possible functions which can be performed. In addition the network processor 135 may in one embodiment be configured or programmed in the programmable logic and interconnections of the PLD (i.e., a soft core). In another embodiment the network processor 135 may be an embedded hardwired circuit or hard core. In yet another embodiment the network processor 135 may be a combination of hard and soft cores.

Figure 2:
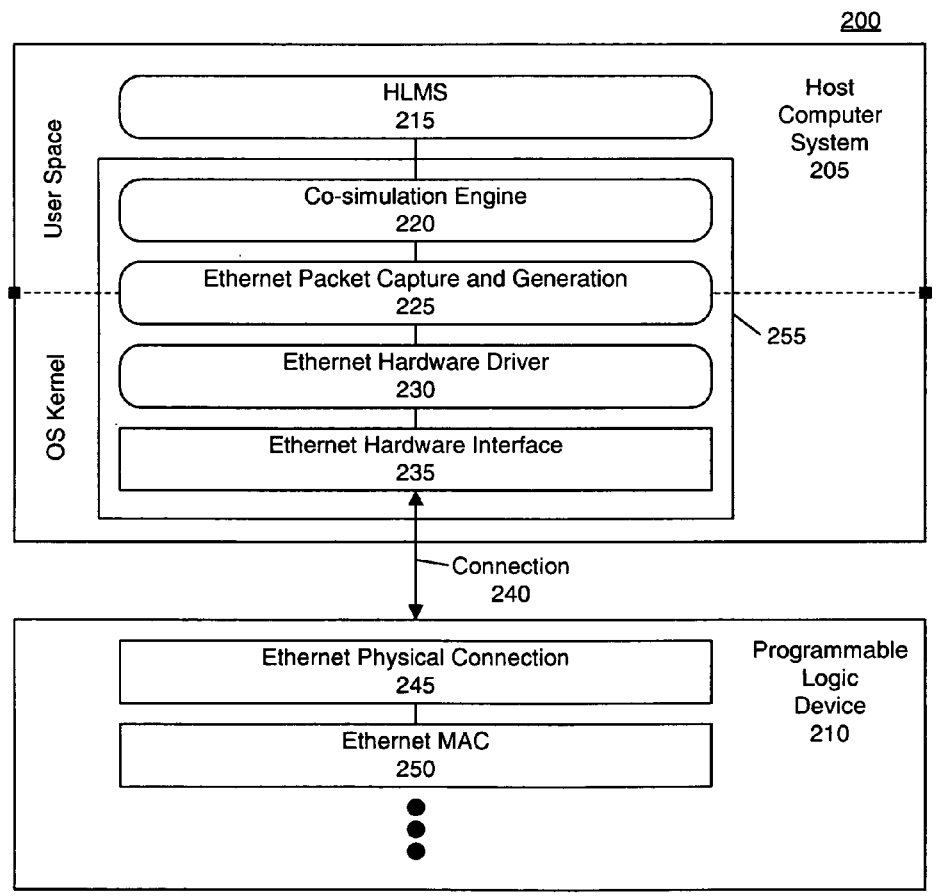
FIG. 2 is a schematic diagram illustrating an architecture for a hardware co-simulation interface in accordance with one embodiment of the present invention.

FIG. 2 is a schematic diagram illustrating an architecture 200 for a hardware co-simulation interface in accordance with one embodiment of the present invention. The architecture 200 utilizes point-to-point Ethernet communications between the host computer system 205 and the PLD 210. Bypassing the full standard network protocol stack, for example a TCP/IP stack, and directly manipulating the lowest possible layer, i.e. the data link layer, provides flexibility to implement minimum but essential functions. Further, such functions can be specific and adaptive to the application at hand. That is, such functions can be customized more easily. For instance, skipping the multiple layers of network encapsulation removes redundancy error detection mechanisms, excessive memory copies and manipulations across the protocol stack, and simplifies the addressing scheme as well as the packet classification process.

As shown, the hardware co-simulation interface can be implemented partially within a host computer system 205 and partially within a programmable logic device 210. The host computer system 205 can be implemented as a computer system, having an appropriate operating system. The host computer system 205 can include an HLMS 215, a co-simulation engine 220, an Ethernet packet capture and generation (EPCG) module 225, an Ethernet hardware driver 230, as well as an Ethernet hardware interface 235. The co-simulation engine 220, the EPCG module 225, the Ethernet hardware driver 230, as well as the Ethernet hardware interface 235 comprise the portion 255 of the hardware co-simulation interface that is implemented within, or as part of, the host computer system 205.

Both the HLMS 215 and the co-simulation engine 220 are considered applications which can execute in user accessible portions of the host computer system 205. The HLMS 215, as described herein, can be implemented as a software-based, circuit design and/or modeling tool that executes within the host computer system 205. The co-simulation engine 220 serves as an interface between the HLMS 215 and the PLD 210 in that the co-simulation engine 220 translates non-platform specific co-simulation commands originating from HLMS 215 into a platform specific format that is understandable by PLD 210.

The EPCG module 225, which is considered to be part of both the user-space and the operating system kernel portions of host computer system 205, provides link-layer network access within the operating system environment. The EPCG module 225 allows applications to capture and transmit network packets bypassing the protocol stack. The EPCG 225 further can provide kernel-level packet filtering. In one embodiment of the present invention, the EPCG 225 can be implemented using WinPcap, which is a software-based networking toolset available from CACE Technologies of Davis, Calif. The EPCG 225 can include a driver that extends the operating system to provide low-level network access as well as a library that is used to access the low-level network layers.

It should be appreciated that other packet capture and generation products also can be used and that such products may vary according to the particular operating system executing within the host processing system 205. Accordingly, the present invention is not intended to be limited by the particular type of packet capture and generation technology used. Further, particular types of products or technologies mentioned within this document are noted for purposes of illustration only.

Continuing, Ethernet hardware driver 230 provides the operational software necessary to drive the Ethernet hardware interface 235. In one embodiment, the Ethernet hardware interface can be implemented as a network interface card. Other hardware Ethernet adapters, however, can be used whether such adapters are PCI-to-Ethernet, USB-to-Ethernet, PCMCIA-to-Ethernet, or the like. It should be appreciated that use of raw Ethernet protocol encapsulation allows this kind of interface translation to be implemented more easily and cost effectively. In illustration, in cases where an interface protocol employs a smaller packet size, having a full TCP/IP-like protocol encapsulation may result in unnecessary packet fragmentation and reassembly. A full TCP/IP-like protocol encapsulation further can increase buffer requirements.

The host computer system 205 communicates with the PLD 210 via a point-to-point Ethernet connection 240. Point-to-point Ethernet connection 240 links the host computer system 205 with the PLD 210 directly, without other systems being present on the network. This simplifies the processing that must be performed resulting in less overhead than would otherwise be required with a more enabled Ethernet communication link and/or network implementation.

PLD 210, as noted, can be implemented as an FPGA. It should be appreciated that FIG. 2 presents a simplified view of PLD 210 which is intended to illustrate only selected aspects of the device in relation to point-to-point Ethernet connection 240. The architecture of PLD 210 will be described in further detail herein. In any case, PLD 210 can include an Ethernet physical connection 245 as well as an Ethernet MAC 250, both of which can be considered part of the hardware co-simulation interface portion that resides on PLD 210.

Ethernet physical connection 245 provides the physical connectivity to the point-to-point Ethernet connection 240. Ethernet physical connection 245 can be comprised of one or more pins and/or input stages of the PLD 205 that receive signals from the point-to-point Ethernet connection 240. Ethernet MAC 250, in general, can be implemented as a sub-layer of the data link networking layer. This sub-layer can communicate directly with the Ethernet physical connection 245 and is responsible for framing, multi-access control, and delivering error-free data. An example of an Ethernet MAC is described Virtex-4 Embedded Tri-Mode Ethernet MAC User Guide, UG074 (v1.3) Sep. 7, 2005, from Xilinx, Inc. of San Jose, Calif., which is herein incorporated by reference. A Ethernet MAC is provided in the Virtex 4 FX FPGA from Xilinx. Another example of an Ethernet MAC is the Tri-mode MAC Logicore IP softcore (datasheet DS297, Jan. 18, 2006), commercially available from Xilinx, Inc.

Figures 3, 4:
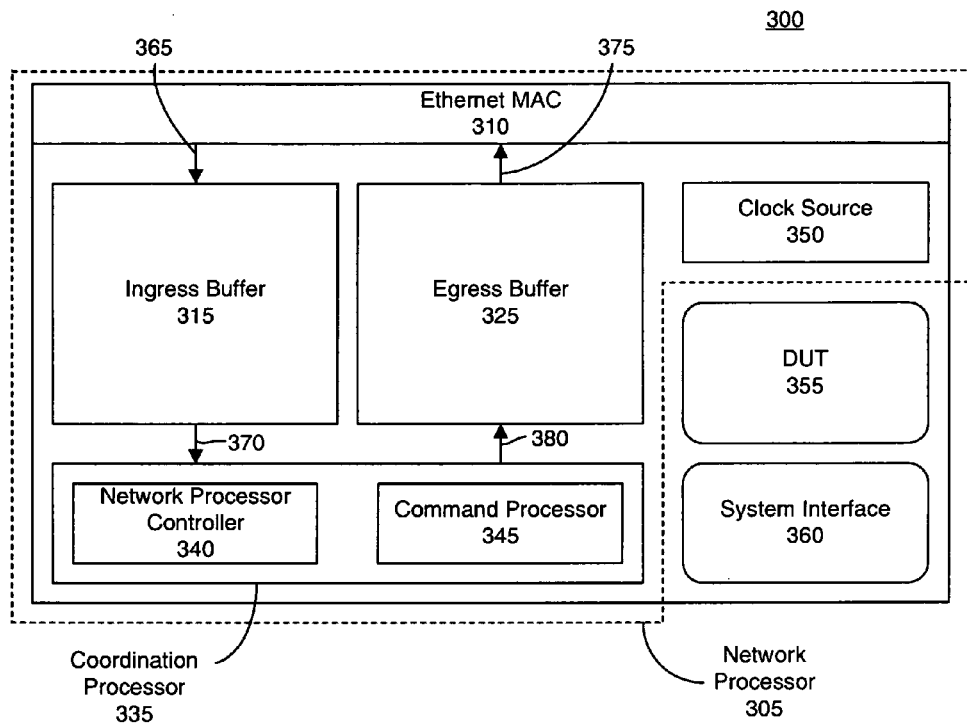
FIG. 3 is a schematic diagram illustrating an architecture for a network processor in accordance with the inventive arrangements disclosed herein.
FIG. 4 is a schematic diagram illustrating a structure for a frame that can be exchanged over a communication link between a programmable logic device and a host computing system in accordance with another embodiment of the present invention.

FIG. 3 is a schematic diagram illustrating an architecture for a network processor in accordance with the inventive arrangements disclosed herein. In general, PLD 300, which can be implemented as an FPGA, can be divided into two portions. The first portion is occupied by a network processor 305 implementation which is part of the hardware co-simulation interface that resides on the PLD. The second portion is occupied by remaining resources that are available for other uses and/or applications such as the DUT 355 and the system interface 360.

In addition to Ethernet MAC 310, the network processor 305 can include an ingress buffer 315, an egress buffer 325, as well as a coordination processor 335. The network processor 305 further can include clock source 350. The ingress buffer 315 can perform functions such as buffering, queuing, filtering, metadata processing, and header removal. The ingress buffer 315 and the egress buffer 325 can be implemented using any of a variety of suitable memory structures or devices. Examples of possible memory types can include, but are not limited to, Random Access Memory (RAM) and first-in-first-out (FIFO) memory. It also should be appreciated that while the ingress and egress buffers 315 and 325 are shown as being implemented within the PLD 200, in another embodiment, the ingress and egress buffers 315 and 325 can be implemented as memory that is external to the PLD 200.

In yet another embodiment, the ingress buffer 315 can be formed from one or more block memories (BRAM's) that are embedded inside the PLD 300. The BRAM's can be dual port BRAM's where each data port can operate at a different clock frequency. Further, each data port of the dual port BRAM can be configured with a different memory aspect ratio. Egress buffer 325 can perform functions such as buffering and header injection. Like ingress buffer 315, egress buffer 325 can include one or more BRAM's forming an output buffer. The BRAM's of the egress buffer 325 also can be dual port BRAM's where each data port is driven at a different clock frequency and further may have a different memory aspect ratio.

The coordination processor 335 can include a network processor controller (NPC) 340 and a command processor 345. Though described as processors, both the NPC 340 and the command processor 345 can be implemented with logic from the fabric of PLD 300 and need not be implemented using actual processor or CPU resources. That is, neither NPC 340 nor the command processor 345 need be implemented using processor logic or program code interpreted by such processor logic. The NPC 340 can process packets stored within ingress buffer 315, which were received from the network interface 310, and remove header information from the packets. Processed packets can be forwarded from the NPC 340 to the command processor 345, which functions as an interface to the portions of the PLD 300 located outside of the network processor 305. With respect to outgoing packets, the NPC 340 can obtain data from the command processor 345 and write such data to egress buffer 325. Egress buffer 325 can be pre-initialized to include a vector specifying header information which can be used by the NPC 340 to inject header information into data written into BRAM 330, thereby packetizing the data.

Clock source 350 can drive various portions of the PLD 300. In one embodiment, clock source 350 can include a plurality of different clock sources capable of driving components at different frequencies. In an embodiment where BRAM's are used to implement the ingress and/or egress buffers 315 and 325, different ones of the data ports of the BRAM's can be driven at different frequencies. For example, data port 365 of ingress buffer 315 and data port 375 of egress buffer 325 can be driven by clock source 350 at the same frequency at which Ethernet MAC 310 is driven. This frequency can conform to the network communication protocol used to communicate with the host computer. In the case where Gigabit Ethernet is used, the frequency can be, for example, 125 MHz. The data ports of the ingress and egress buffers 315 and 325 that are connected with the coordination processor 335, i.e. data ports 370 and 380, can be driven at a different clock rate, such as the frequency at which the coordination processor 335 operates. This can be the same frequency as the rest of the PLD 300. Operating the different data ports of at different frequencies allows each buffer to perform clock domain crossing as data can be read into each buffer using one data port clocked at a first frequency and read out via a different data port clocked at a second and different frequency.

The command processor 345 functions as an application specific interface to the remainder of PLD 300. In this case, for example, the command processor 345 performs various co-simulation interface functions, being able to process co-simulation data. The command processor 345 communicates with DUT 355 via a system interface 360. It should be appreciated that were the functions of the remaining portions of the PLD 300, in this case the DUT 355, to be changed, the implementation of command processor 345 also would be changed to provide any command and/or data interpretation necessary for the selected application and to communicate with the other on-chip systems and/or devices. Additionally, in another embodiment, the command processor 345 can be implemented external to the network processor 305, but still within PLD 300.

As noted, use of ingress and egress buffers 315 and 325 reduces operations such as packet buffering, classification/ qualification, and header removal into read/write operations implemented within the buffers. The operations can be carried out concurrently and "on-the-fly" when the packet data is streamed into an ingress buffer of the network processor. Header removal and injection can be achieved with little or no latency by adjusting the buffer address.

Implementing the network processor 305 using a PLD 300 allows various aspects of the network processor 305 to be changed or altered through the use of various parameters. More particularly, selected functions and/or components of network processor 305 can be changed by setting different values for hardware description language (HDL) generics during compilation. In illustration, it may be desirable to change the size of the ingress buffer 315 and/or egress buffer 325 at compile time to optimize resource usage for a given application. Some applications may not require a memory buffer that is as large as that which may required by other applications. Other modules and/or functions of the network processor 305 can be modified as may be required according to the particular application in which the network processor 305 is to be used. Such modifications can be accomplished by changing the values of other HDL generics. Such parameterization is possible as the network processor 305 is implemented using PLD technology.

Ethernet MAC 310 of the PLD receives input from the host computer system in the form of a byte stream. Ethernet MAC 310 stores the incoming packets within a sequential address space within the ingress buffer 315. In one embodiment, the sequential address space of the ingress buffer 315 further can be pre-initialized with a 16 byte vector starting at address 0. The portion of the address space containing the 16 byte vector can be maintained as read-only memory. The vector can be used to store an Ethernet header template which can be used by the NPC 340 to filter out unrelated packets.

Incoming packets can be matched against the vector stored in the ingress buffer 315. Any packets that do not match can be discarded. If (1) the destination MAC address is the PLD 300 MAC address, if (2) the source MAC address is the host computer system MAC address, and if (3) the EthType is a predefined value indicating co-simulation, the packet is co-simulation related. After the header of the incoming packet is examined and is determined to be co-simulation related, the remaining packet data are written to ingress buffer 315.

Thus, for the NPC 340 to filter incoming frames, the MAC addresses of the host computer system and PLD 300 must be specified and stored as the Ethernet header template in the ingress buffer 315 and egress buffer 325 before co-simulation begins. As noted, a header template can be pre-installed in the egress buffer 325 and used for injecting header information to packetize co-simulation data being sent from the network processor to the host computer system.

Ethernet header templates can be installed through buffer content initialization using a tool such as the Data2MEM Memory Tool (Data2MEM) available from Xilinx, Inc. of San Jose, Calif. Data2MEM allows binary code to be converted into memory contents. The code becomes part of the bitstream used to configure PLD 300. This technique for initializing memory eliminates the need to rerun synthesis, implementation, and bitstream generation phases of PLD development. Further, facilitating post-implementation modification of the Ethernet header template allows users to choose different network interface cards after a particular PLD design has been compiled. A tool such as Data2MEM allows the Ethernet header template to be dynamically modified to reflect the current host MAC address before co-simulation begins and supports bitstream reuse, thereby saving time.

It should be appreciated that while the NPC 340 can perform one variety of packet classification, Ethernet MAC 310 can perform another variety of packet classification. Ethernet MAC 310 can determine whether a received packet is qualified or unqualified by examining the FCS portion of the packet. If the FCS portion of the packet includes an error, the packet can be marked as a bad packet or frame. Ethernet MAC 310 further can mark a frame as bad in the case of an overflow of the address space.

FIG. 4 is a schematic diagram illustrating a structure for a raw Ethernet frame 400 which can be exchanged over a communication link between a PLD and a network-connected system in accordance with another embodiment of the present invention. More particularly, frame 400 can be used in the context of hardware co-simulation between a host computer system and a PLD having a network processor disposed therein. While any of a variety of different communication protocols can be used, frame 300 illustrates a structure for an Ethernet frame that can be transmitted over a point-to-point Ethernet communication link.

In general, the terms "frame" and "packet" are used interchangeably throughout this document to refer to the unit of data exchanged between the host computer system and the PLD. In the context of Ethernet-based communication between the host computer system and the PLD, the term "frame" can refer to a raw Ethernet frame formatted according to IEEE standard 802.3. Specifically, the Ethernet II frame format can be used where the $13^{th}$ and the $14^{th}$ bytes immediately following the preamble are used as a type field for protocol identification. Accordingly, the term "packet" can refer to a frame in the context of Ethernet co-simulation, which has the appropriate alignment in the frame layout and which encapsulates metadata and commands and/or responses as the frame payload.

Figure 5:
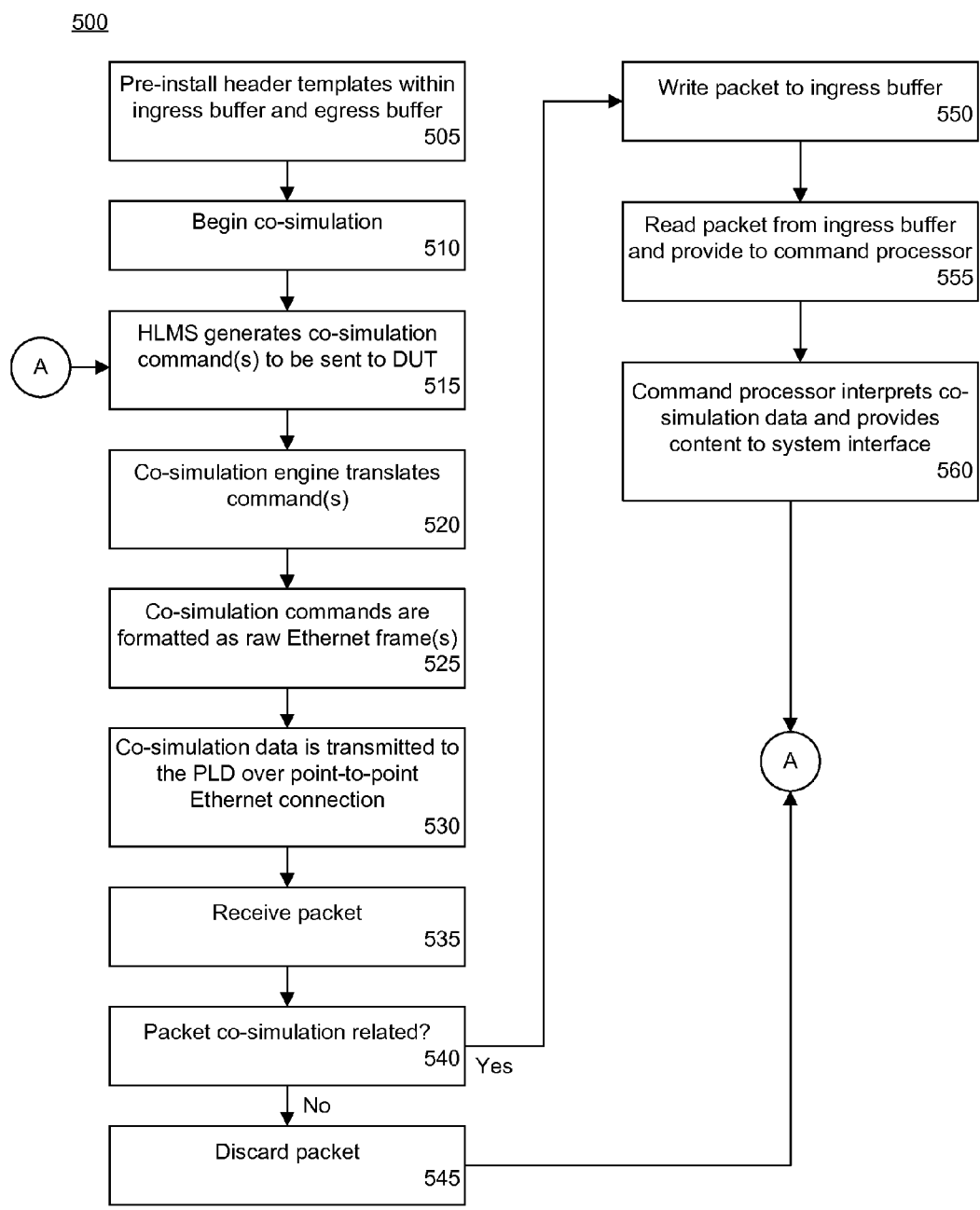
FIG. 5 is a flow chart illustrating a method for hardware co-simulation in accordance with another embodiment of the present invention.

FIG. 5 is a flow chart illustrating a method 500 for hardware co-simulation in accordance with one embodiment of the present invention. Method 500 can be performed by a hardware co-simulation interface as described herein. Accordingly, method 500 can begin in step 505, where header templates can be pre-installed in the buffers for both the ingress and egress buffers. As noted, the header templates can specify the MAC address of the host computer system as well as the PLD being incorporated into the co-simulation session.

In step 510, a hardware co-simulation session can be started between the PLD and the host computing system. In one embodiment, the PLD can be an FPGA having a DUT implementation as well as a network processor implemented thereon. The host computer system can execute a software design and/or modeling system such as an HLMS or the like. In step 515, the HLMS can generate one or more hardware co-simulation commands intended to be transmitted to the DUT within the PLD. The co-simulation commands are generalized in nature and are not specific, or understandable to, the PLD to which the commands will be sent.

In step 520, the co-simulation engine can translate the co-simulation command(s) from the non-platform specific format to a format that is platform specific to the PLD and/or the DUT residing thereon. In step 525, the EPCG module can format the translated co-simulation commands, as well as any co-simulation data included as part of such commands, as one or more raw Ethernet frames. In step 530, the raw Ethernet frames are transmitted over the point-to-point Ethernet connection to the PLD. More particularly, the raw Ethernet frame(s), after formatting by the EPCG, can be provided to the Ethernet hardware driver and the Ethernet hardware interface of the host computing system which transmits the frames to the PLD over the direct Ethernet connection.

In step 535, the Ethernet MAC of the network processor within the PLD can receive the raw Ethernet packet(s) via the point-to-point Ethernet connection. Incoming packets arrive at the network processor as byte-streams. In step 540, a determination can be made as to whether the received packet is related to co-simulation. In particular, the network interface can compare the header information of the received packet with the pre-installed vector stored within the ingress buffer. If the two match, the packet is determined to be co-simulation related and the method can proceed to step 550. If the packet header information does not match the vector stored within the ingress buffer, the method can proceed to step 545, where the packet is discarded or ignored by the network processor as it is unrelated to co-simulation. The method can continue as indicated until such time as the hardware co-simulation ends or is stopped.

It should be appreciated that the network interface further can analyze the received packet to ensure that it conforms to the communication protocol used between the PLD and the host computer system. For example, in the case of Ethernet frames, the network interface can evaluate the packet for an FCS error or detect situations in which an overflow condition exists in the input buffer. In either case, the network interface can mark the frame as a "bad frame".

Continuing with step 550, the packet is written to the ingress buffer. The packet can be written to the ingress buffer via the data port which is coupled to the network interface. This data port can be clocked at the same frequency as the network interface and further have a bit width which conforms to the network interface. In an embodiment where Ethernet is used, the data port can have a width of 8 bits, for example.

In another embodiment of the present invention, the ingress buffer can be configured to include two identical address spaces. For example, in one embodiment the ingress buffer can be implemented using a BRAM-based ping-pong type of memory buffer. Once an entire qualified packet is written into the first address space, the reception process can be switched to the second address space. This allows the first address space to be controlled by the coordination processor, and particularly the NPC, while the second address space receives a new packet. Accordingly, the ingress buffer can be switched to alternate between the first address space and the second address space thereby allowing uninterrupted data reception and processing.

In step 555, the packet can be read from the ingress buffer and supplied to the command processor. The packet can be read via a data port of the ingress buffer which is coupled to the command coordination processor, and particularly the command processor. Accordingly, this data port can be clocked at the same frequency as the command processor and further have a width which conforms to the command processor. As noted, in one embodiment, the width of this data port can be 32 bits. By receiving and sending data using different data ports being clocked at different frequencies, the ingress buffer can span multiple clock domains and perform data width conversions.

The NPC can read the packet from the ingress buffer starting at an address which indicates a location in memory immediately following the end of the header information and the metadata of the received packet. The header information and the metadata are discarded. In this manner, the header information and metadata effectively are removed with little or no latency. The NPC then provides the resulting co-simulation data, i.e. the packet data with the header information and metadata removed, to the command processor.

In step 560, the command processor performs any interpretation and/or further processing of the co-simulation data which may be required and passes the resulting co-simulation data on to the system interface. For example, the command processor can be configured to condition the co-simulation data for use by the DUT. In any case, the co-simulation data, i.e. co-simulation commands and/or data from the HLMS, then can be used by the DUT for processing.

Figure 6:
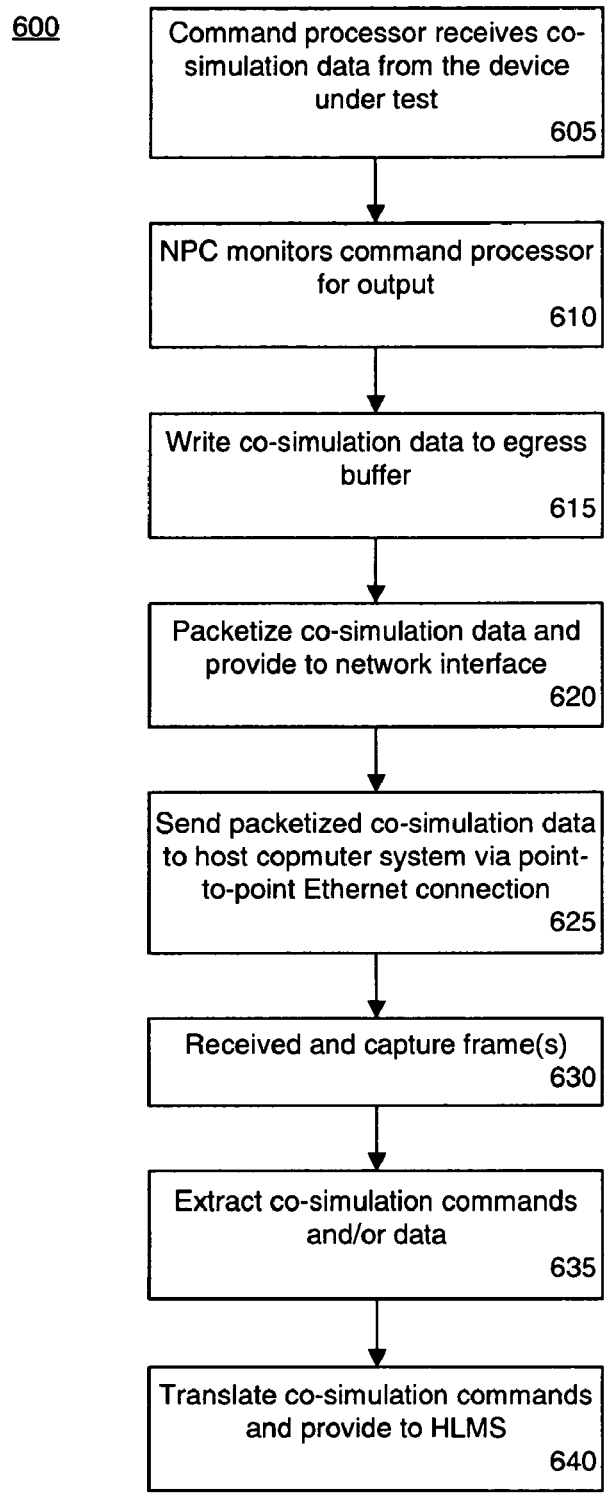
FIG. 6 is a flow chart illustrating a method for hardware co-simulation in accordance with yet another embodiment of the present invention.

FIG. 6 is a flow chart illustrating a method 600 for hardware co-simulation in accordance with one embodiment of the present invention. More particularly, method 600 describes a process of sending data from the DUT to the host processing system in accordance with one embodiment of the present invention. In step 605, the command processor can receive co-simulation data from the DUT. The command processor can perform any processing that may be required in terms of conditioning the co-simulation data for use by the host computer system.

In step 610, the NPC continuously monitors the command processor for output. In step 615, the NPC receives the co-simulation data as output from the command processor and writes the co-simulation data to the egress buffer. As noted, the egress buffer can include a pre-loaded header template. In this case, the header information can be 16 bytes of data necessary for constructing an Ethernet packet header.

The NPC writes the co-simulation data to the egress buffer consecutively and immediately following the pre-installed header template. In this manner, the NPC effectively wraps, or encapsulates, the co-simulation data with the Ethernet header information necessary to form a packet and transmits the packet to the host computer system. The NPC writes the co-simulation data to the output buffer via a data port which is coupled to the coordination processor. This data port can be clocked at the same rate as, and have the same bit width as the command processor.

Another advantage of implementing the network processor using a PLD is that the ingress and/or egress memories can be reprogrammed at runtime. That is, using reconfiguration techniques supported by the target PLD, i.e. the PLD in which the network processor is implemented, the pre-installed protocol header template may be modified before the start of simulation. As noted, a tool such as Data2MEM, for example, can be used to reprogram the size and/or contents of one or both of the buffer memories. This allows the network processor to be dynamically modified to support different communication protocols.

In step 620, the Ethernet MAC can take possession of the egress buffer and read the packet. The Ethernet MAC reads the packet from a data port of the egress buffer which has a same bit width as the Ethernet MAC and is further clocked at the same rate. Accordingly, the egress buffer facilitates the spanning of multiple clock domains. This allows the egress buffer to perform data width conversion as well. As noted, the Ethernet MAC can read the content of the egress buffer starting at the beginning of the Ethernet header template and continue through the end of the co-simulation data, thereby ensuring that the entire packet is read and sent to the host computer system.

In step 625, the Ethernet MAC can send the packet(s) to the host computer system over the point-to-point Ethernet connection. As noted, the packet(s) can be formatted and sent as raw Ethernet frames. In step 630, the host processing system, through the Ethernet hardware interface and the Ethernet hardware driver can receive the packet(s). The EPCG can capture the frames for processing. In step 635, the co-simulation commands and/or data received from the PLD can be extracted from the received frames. In step 640, the co-simulation engine translates the extracted co-simulation command (s) and/or data from the non-platform specific format to the platform specific format that is understandable by the HLMS and which coincides with the operating system of the host computing system. The HLMS then can make use of such data within the simulation.

The present invention can be realized in hardware, software, or a combination of hardware and software. The present invention can be realized in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically, i.e. communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. An Ethernet co-simulation interface for use with a software-based simulation tool and a design under test disposed on a programmable device, said co-simulation interface comprising:

a host interface executing on a host computing system, wherein said host interface facilitates data transfer between the software-based simulation tool and a communication link to the design under test during hardware co-simulation; and a network processor implemented within the programmable device, wherein said network processor facilitates data transfer between the communication link and the design under test during hardware co-simulation;

wherein said host interface and said network processor exchange hardware co-simulation data formatted as Ethernet frames over a point-to-point Ethernet connection bi-directionally during hardware co-simulation.

2. The Ethernet co-simulation interface of claim 1, said host interface further comprising a co-simulation engine, wherein said co-simulation engine translates commands from a non-platform specific format that is compatible with the host computing system into a platform specific format that conforms to the programmable device.

3. The Ethernet co-simulation interface of claim 1, said host interface further comprising a hardware interface communicatively linking the host computing system with the point-to-point Ethernet connection.

4. The Ethernet co-simulation interface of claim 1, said host interface further comprising an Ethernet packet processing layer, wherein said Ethernet packet processing layer captures packets received over the point-to-point Ethernet connection and formats packets for transmission over the point-to-point Ethernet connection.

5. The Ethernet co-simulation interface of claim 1, said network processor further comprising an Ethernet media access control, wherein said Ethernet media access control routes co-simulation data between the point-to-point Ethernet connection and an ingress buffer and an egress buffer of said network processor.

6. The Ethernet co-simulation interface of claim 5, said network processor further comprising a network processor controller, wherein said network processor controller extracts co-simulation commands and co-simulation data from Ethernet frames stored within said ingress buffer and provides the co-simulation commands and co-simulation data to said command processor, wherein said network processor controller formats co-simulation data from said command processor as outgoing, Ethernet frames and provides the outgoing, Ethernet frames to said egress buffer.

7. The Ethernet co-simulation interface of claim 1, said network processor further comprising a command processor, wherein said command processor is configured to route co-simulation data between said network processor and the design under test.

8. The Ethernet co-simulation interface of claim 1, wherein said network processor is reconfigurable at co-simulation runtime.

9. The Ethernet co-simulation interface of claim 1, wherein the network processor does not include a processor configured to execute a network protocol stack.

10. A method of routing co-simulation data between a software-based simulation tool executing on a host computing system and a design under test implemented on a programmable device, said method comprising:

within the host computing system during hardware co-simulation, translating a co-simulation command between a non-platform specific format that conforms with the host computing system and a platform specific format that conforms with the design under test; and encapsulating the co-simulation command that conforms with the platform specific format as at least one raw Ethernet frame for transmission over a point-to-point Ethernet connection to the programmable device;

within the programmable device, during hardware co-simulation, buffering the raw Ethernet frame from the host computing system in an ingress buffer; and extracting the co-simulation command from the raw Ethernet frame and providing the co-simulation command to the design under test for execution.

11. The method of claim 10, further comprising, within the programmable device, qualifying the raw Ethernet frame as being ready to use for hardware co-simulation according to a comparison with a predetermined packet structure stored in the ingress buffer.

12. The method of claim 10, further comprising, within the programmable device, receiving co-simulation data from the design under test and placing the co-simulation data in an egress buffer, whereby an Ethernet header is inserted into the co-simulation data thereby formatting the co-simulation data as at least one raw Ethernet frame.

13. The method of claim 10, further comprising configuring the programmable device to handle raw Ethernet frames without a processor for executing a network protocol stack.

14. The method of claim 10, further comprising, within the host computing system, updating a bitstream used to configure at least a portion of the programmable device at co-simulation runtime.

15. The method of claim 10, further comprising, responsive to a bitstream specifying Ethernet configuration information, reconfiguring at least a portion of the programmable device at co-simulation runtime.

16. A machine readable storage having stored thereon a computer program having a plurality of code sections that, when executed by a computer system, causes the computer system to perform a plurality of steps, the machine readable storage comprising:

code for translating a co-simulation command, within a host computing system, between a non-platform specific format that conforms with the host computing system and a platform specific format that conforms with a design under test implemented on a programmable device during hardware co-simulation;

code for encapsulating, within the host computing system, the co-simulation command that conforms with the platform specific format as at least one Ethernet frame for transmission over a point-to-point Ethernet connection to the programmable device during hardware co-simulation;

code for creating an ingress buffer within the programmable device that buffers the Ethernet frame from the host computing system during hardware co-simulation; and code for causing the co-simulation command to be extracted from the Ethernet frame within the programmable device and for causing the co-simulation command to be provided to the design under test for execution during hardware co-simulation.

17. The machine readable storage of claim 16, further comprising, code for, within the programmable device, qualifying the Ethernet frame as being ready to use for hardware co-simulation according to a comparison with a predetermined packet structure stored within the ingress buffer.

18. The machine readable storage of claim 16, further comprising code for updating a bitstream to reconfigure at least a portion of the programmable device at co-simulation runtime.

19. The machine readable storage of claim 16, further comprising, code for, within the programmable device, receiving co-simulation data from the design under test and placing the co-simulation data in an egress buffer, whereby an Ethernet header is inserted into the co-simulation data thereby formatting the co-simulation data as at least one Ethernet frame.

20. The machine readable storage of claim 16, further comprising, code for configuring the programmable device to process Ethernet frames without a processor for executing a network protocol stack.

\* \* \* \* \*

UNITED STATES PATENT AND TRADEMARK OFFICE
CERTIFICATE OF CORRECTION

PATENT NO. : 7,636,653 B1  
APPLICATION NO. : 11/343367  
DATED : December 22, 2009  
INVENTOR(S) : Chan et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 997 days.

Signed and Sealed this

Ninth Day of November, 2010

David J. Kappos  
*Director of the United States Patent and Trademark Office*